United States Patent
Yoshisato et al.

(10) Patent No.: US 6,518,658 B2
(45) Date of Patent: Feb. 11, 2003

(54) SURFACE-MOUNTING TYPE ELECTRONIC CIRCUIT UNIT SUITABLE FOR MINIATURIZATION

(75) Inventors: Akiyuki Yoshisato, Fukushima-ken (JP); Kazuhiko Ueda, Fukushima-ken (JP); Yasuhio Ikarashi, Fukushima-ken (JP); Akihiko Inoue, Fukushima-ken (JP); Hiroshi Sakuma, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/870,384

(22) Filed: May 29, 2001

(65) Prior Publication Data
US 2002/0011658 A1 Jan. 31, 2002

(30) Foreign Application Priority Data
May 30, 2000 (JP) ........................... 2000-160249
May 30, 2000 (JP) ........................... 2000-160272
May 30, 2000 (JP) ........................... 2000-160282

(51) Int. Cl.$^7$ ............................................. H01L 23/12
(52) U.S. Cl. ............. 257/701; 257/701; 257/723; 257/707; 257/712; 257/718; 257/719; 361/707; 361/719; 174/255; 174/260
(58) Field of Search ............................. 257/778, 531, 257/532, 712, 678, 717, 718, 719, 763, 766, 772, 774, 777, 350, 528, 533; 361/303

(56) References Cited

U.S. PATENT DOCUMENTS

| | | | | |
|---|---|---|---|---|
| 5,561,592 A | * | 10/1996 | Furutani et al. | 361/707 |
| 5,877,533 A | * | 3/1999 | Arai et al. | 257/350 |
| 6,046,409 A | * | 4/2000 | Ishii et al. | 174/255 |
| 6,083,766 A | | 7/2000 | Chen | |
| 6,115,234 A | * | 9/2000 | Ishii et al. | 361/303 |

FOREIGN PATENT DOCUMENTS

JP    Hei 9-74165    3/1997

* cited by examiner

Primary Examiner—Nathan J. Flynn
Assistant Examiner—Fazli Erdem
(74) Attorney, Agent, or Firm—Brinks Hofer Gilson & Lione

(57) ABSTRACT

To provide a surface-mounting type electronic circuit unit suitable for miniaturization, circuit elements including capacitors, resistors and inductance elements and a conductive pattern connected to these circuit elements are thinly formed on an alumina substrate, semiconductor bare chips for a diode and a transistor are bonded on a connection land of the conductive pattern via wire, an inductance element composed of a pair of conductors opposite at a predetermined interval on the aluminum board is thinly formed and a unbalance/balance converter is formed by these conductors.

13 Claims, 8 Drawing Sheets

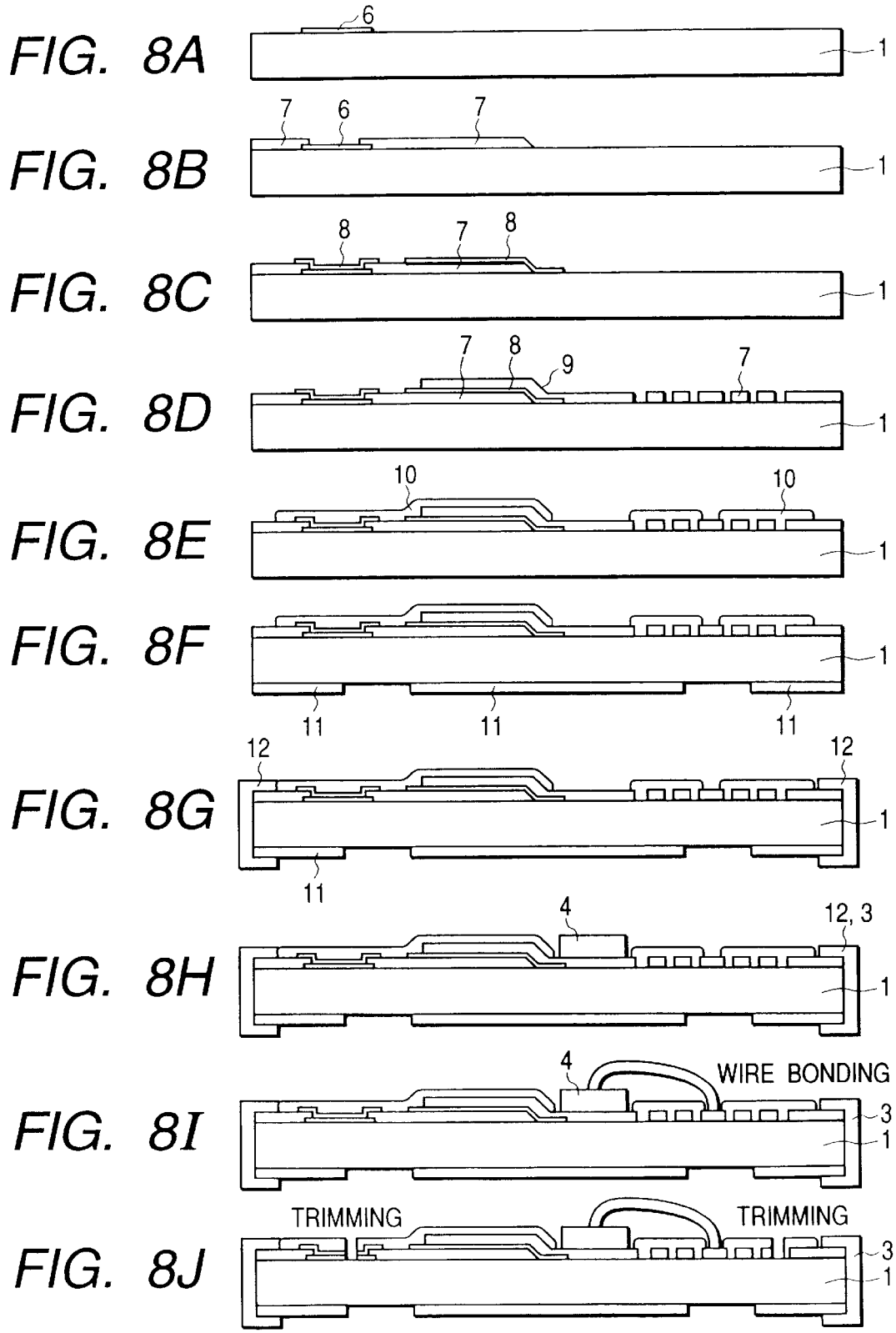

SURFACE-MOUNTING TYPE ELECTRONIC CIRCUIT UNIT SUITABLE FOR MINIATURIZATION

BACKGROUND OF THE INVENTION

1. Field of the Invention

The present invention relates to a surface-mounting type electronic circuit unit.

2. Description of the Related Art

Generally, such a surface-mounting type electronic circuit unit is substantially formed so that various circuit components are soldered on each soldering land of a conductive pattern provided on a board and are covered with a shield. An end-face electrode is provided to the side of the board and when the electronic circuit unit is mounted on the surface of a mother board, the end-face electrode is soldered on a soldering land of the mother board. Circuit components are used according to required circuit configuration including a tuning circuit, a resonant circuit or an amplifying circuit, for circuit components for a resonant circuit for example, a diode, a chip capacitor and an inductor are used, for circuit components for an amplifying circuit, a transistor, a chip resistor, a chip capacitor and an inductor are used and these circuit components are connected via a conductive pattern.

Heretofore, an electronic circuit unit substantially formed as described above on which a unbalance/balance converter for transforming an unbalanced signal to a balanced signal and outputting it is mounted is known. Normally, this unbalance/balance converter is formed by a surface mounting component including a pair of conductors on a flat dielectric substrate, an unbalanced signal can be transformed to a balanced signal in the unbalance/balance converter by soldering an electrode provided on the dielectric substrate on a conductive pattern on a multilayer board and can be output.

Recently, technology for miniaturizing a circuit component such as a chip component and a semiconductor component has remarkably progressed and for example, microminiature chip resistor and chip capacitor the respective outside dimensions of which are approximately 0.6×0.3 mm are also realized. Therefore, if such a microminiature circuit component is also used in the abovementioned conventional type electronic circuit unit and such circuit components are mounted on a board in a state in which pitch between the components is narrowed, the electronic circuit unit can be miniaturized to some extent. However, the miniaturization of a circuit component such as a chip component and a semiconductor component has a limit and in addition, as a part where each circuit component is soldered is required to be prevented from being short-circuited when multiple circuit components are mounted on aboard, the reduction of pitch between components also has a limit and these have greatly prevented the further miniaturization of an electronic circuit unit. Further, as a unbalance/balance converter is formed by a surface mounting component and the surface mounting component is relatively large-sized because a pair of conductors are arranged beside longer than predetermined length to secure a desired degree of coupling, limited mounting space on a board is narrowed by the surface mounting component for the unbalance/balance converter and the miniaturization of an electronic circuit unit is also prevented from this standpoint.

As a distributed inductor for resonance is formed by a microstrip line provided on a multilayer board in the above- mentioned conventional type electronic circuit unit, the microstrip line required to acquire desired Q is extended and the miniaturization of the electronic circuit unit is also prevented from this standpoint.

SUMMARY OF THE INVENTION

The invention is made in view of the situation of such conventional type technique and the object is to provide a surface-mounting type electronic circuit unit suitable for miniaturization and also excellent in a countermeasure for static electricity.

To achieve the object, in the electronic circuit unit according to the invention, circuit elements including a capacitor and a resistor and a conductive pattern connected to these circuit elements are thinly formed on an alumina substrate, a semiconductor bare chip is mounted on the alumina substrate, the semiconductor bare chip is bonded to the conductive pattern via wire, an inductance element composed of a pair of conductors opposite at a predetermined interval on the alumina substrate is thinly formed and an unbalance/balance converter is formed by the inductance element.

According to such configuration, as circuit elements including the capacitor and the resistor are precisely formed using thin-film technology and in addition, a bare chip for a semiconductor device is bonded via wire, circuit components required on the alumina substrate are densely mounted and the surface-mounting type electronic circuit unit suitable for miniaturization can be realized. Further, as the inductance element composed of a pair of conductors is thinly formed on the alumina substrate and the unbalance/balance converter is formed by a pair of conductors of the inductance element, a gap between both conductors is reduced, a desired degree of coupling can be secured and the electronic circuit unit also has an advantage to miniaturization from this standpoint.

In the abovementioned configuration, when a pair of conductors forming the unbalance/balance converter are formed on the same surface of the alumina substrate, a gap between both conductors is reduced and the degree of coupling can be enhanced. Also, when a pair of conductors are laminated on the alumina substrate via the insulator, space for both conductors occupied on the alumina substrate can be more reduced. Further, it is desirable that a pair of conductors are formed in a spiral shape or zigzag.

Also, in the electronic circuit unit according to the invention, circuit elements including a capacitor, a resistor and an inductance element and a conductive pattern connected to these circuit elements are thinly formed on a square flat alumina substrate, a semiconductor bare chip bonded to the conductive pattern via wire is mounted, an electrode for input and an electrode for output respectively connected to the conductive pattern are provided on the side of the alumina substrate and a close part for discharge is provided to the conductive pattern connecting at least one of the electrode for input and the electrode for output and the capacitor.

According to such configuration, as circuit elements including the capacitor, the resistor and the inductance element are precisely formed using thin-film technology and in addition, the bare chip for the semiconductor device is bonded via wire, circuit components required on the alumina substrate are densely mounted and the surface-mounting type electronic circuit unit suitable for miniaturization can be realized. As the close part for discharge is provided to the conductive pattern connecting at least one of the electrode"

for input and the electrode for output and the capacitor though the resistance to voltage of the capacitor particularly out of circuit elements thinly formed on the alumina substrate is reduced, the breakdown of the capacitor by static electricity can be securely prevented and in addition, as the close part can be formed with high dimensional precision by thin-film technology, the gap for discharge in the close part is reduced and discharge at low voltage is enabled.

In the above-described configuration, the conductive patterns are opposite arranged on the alumina substrate, it is desirable that the projection is respectively opposite provided to these conductive patterns to form the close part and as a result, the breakdown of the capacitor by static electricity can be securely prevented.

Also, in the electronic circuit unit according to the invention, circuit elements including a capacitor, a resistor and an inductance element respectively thinly formed and a semiconductor bare chip bonded on an alumina substrate via wire are provided on the alumina substrate, the inductance element includes at least an inductance element for setting a resonance frequency and the inductance element for setting a resonance frequency is thinly formed in a spiral shape.

According to such configuration, as circuit elements including the capacitor, the resistor and the inductance element are precisely formed using thin-film technology and in addition, the bare chip for a semiconductor device is bonded via wire, circuit components required on the alumina substrate are densely mounted and the surface-mounting type electronic circuit unit suitable for miniaturization can be realized. Also, as a concentrated constant type inductor is formed by the inductance element for setting a resonance frequency in a spiral shape thinly formed, distance between the conductors is reduced, the inductance element can be miniaturized and the miniaturization of the electronic circuit unit can also be realized from this standpoint.

In the abovementioned configuration, it is desirable that Cu plating is provided on the surface of the inductance element in a spiral shape forming the inductance element for setting a resonance frequency and hereby, Q of a resonant circuit can be enhanced.

Also, in the abovementioned configuration, it is desirable that a conductive pattern for regulation connected to the inductance element for setting a resonance frequency is thinly formed and the number of turns of the inductance element for setting a resonance frequency is increased by trimming the conductive pattern for regulation to regulate a resonance frequency and hereby, a resonance frequency can be simply regulated. In this case, it is desirable that the conductor width of the trimmed conductive pattern for regulation and the conductor width of the inductance element f or setting a resonance frequency are substantially equalized and hereby, the characteristic impedance of both is equal.

BRIEF DESCRIPTION OF THE DRAWINGS

FIGS. 8A to 8J are explanatory drawings showing a manufacturing process of the electronic circuit unit;

DETAILED DESCRIPTION OF THE PREFERRED EMBODIMENTS

Figure 1:
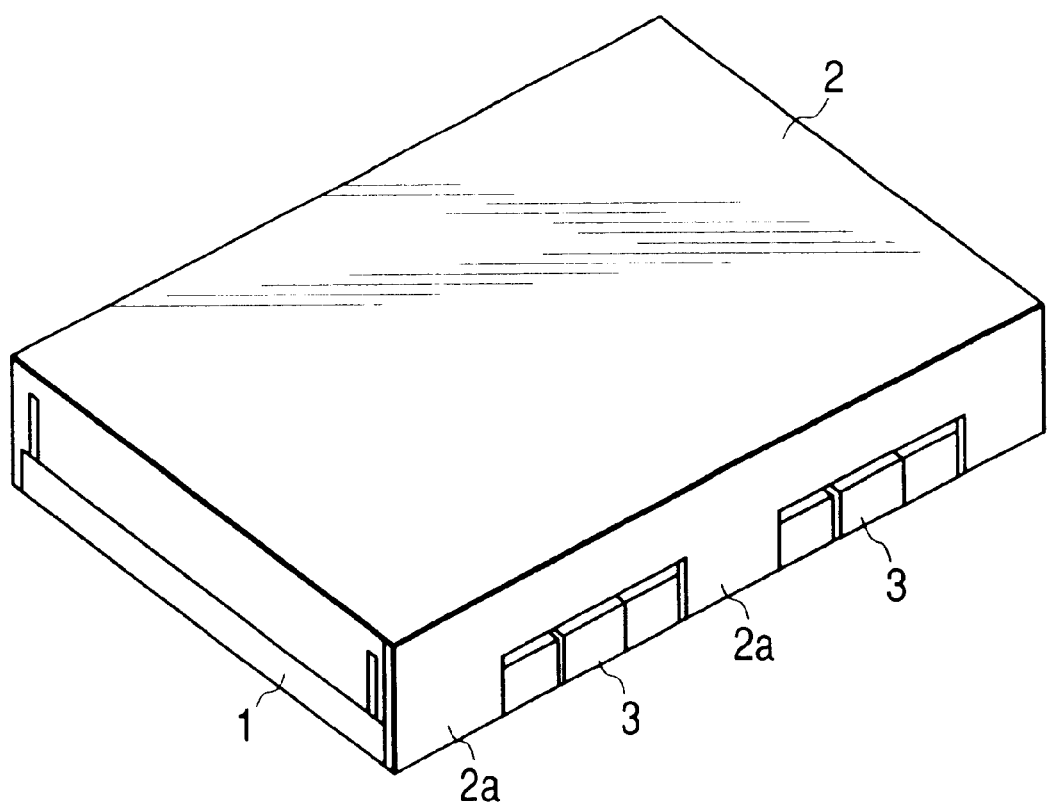
FIG. 1 is a perspective view showing an electronic circuit unit equivalent to an embodiment of the invention.
Figure 2:
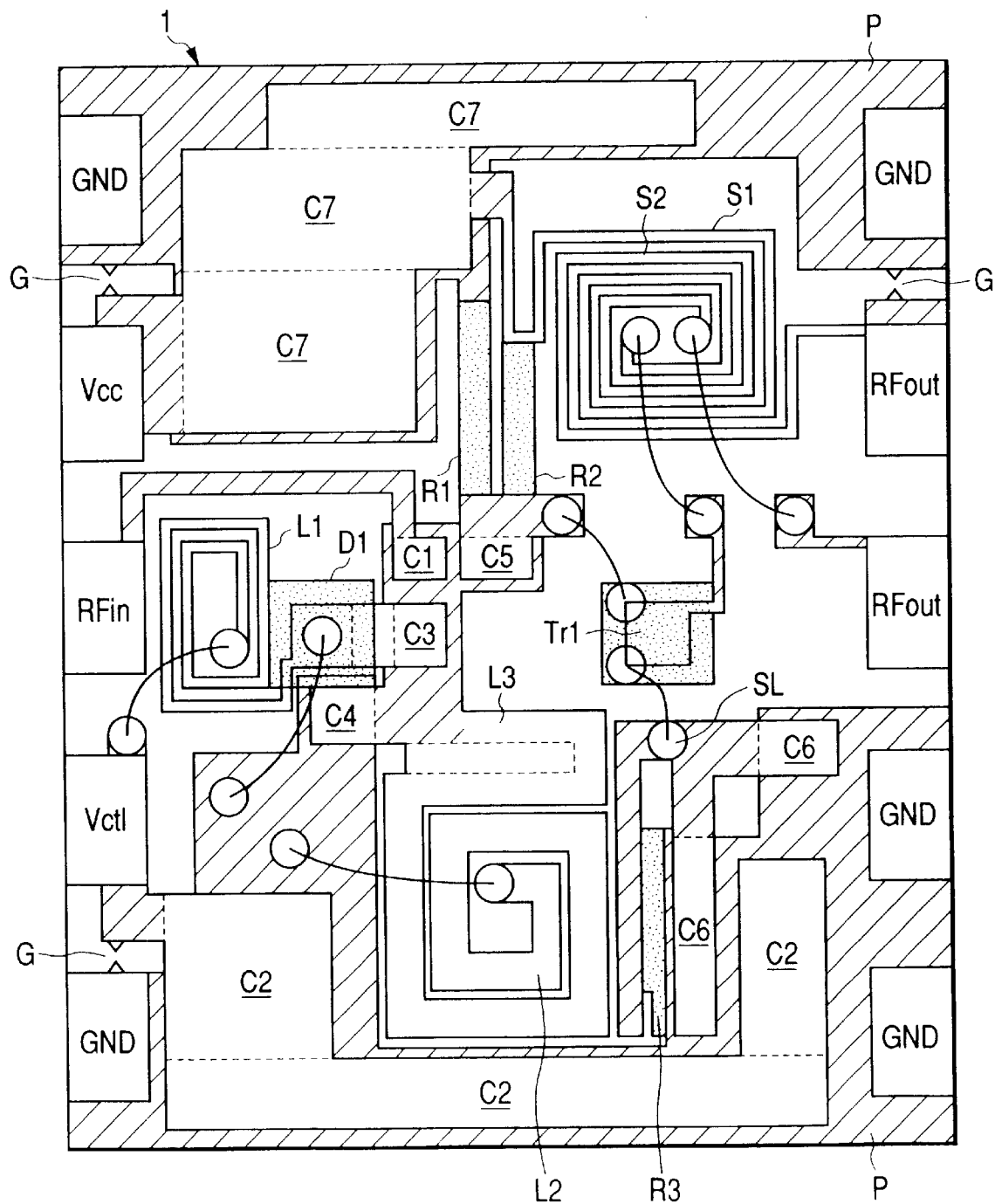
FIG. 2 is a plan showing the circuit configuration layout of an alumina substrate.
Figure 3:
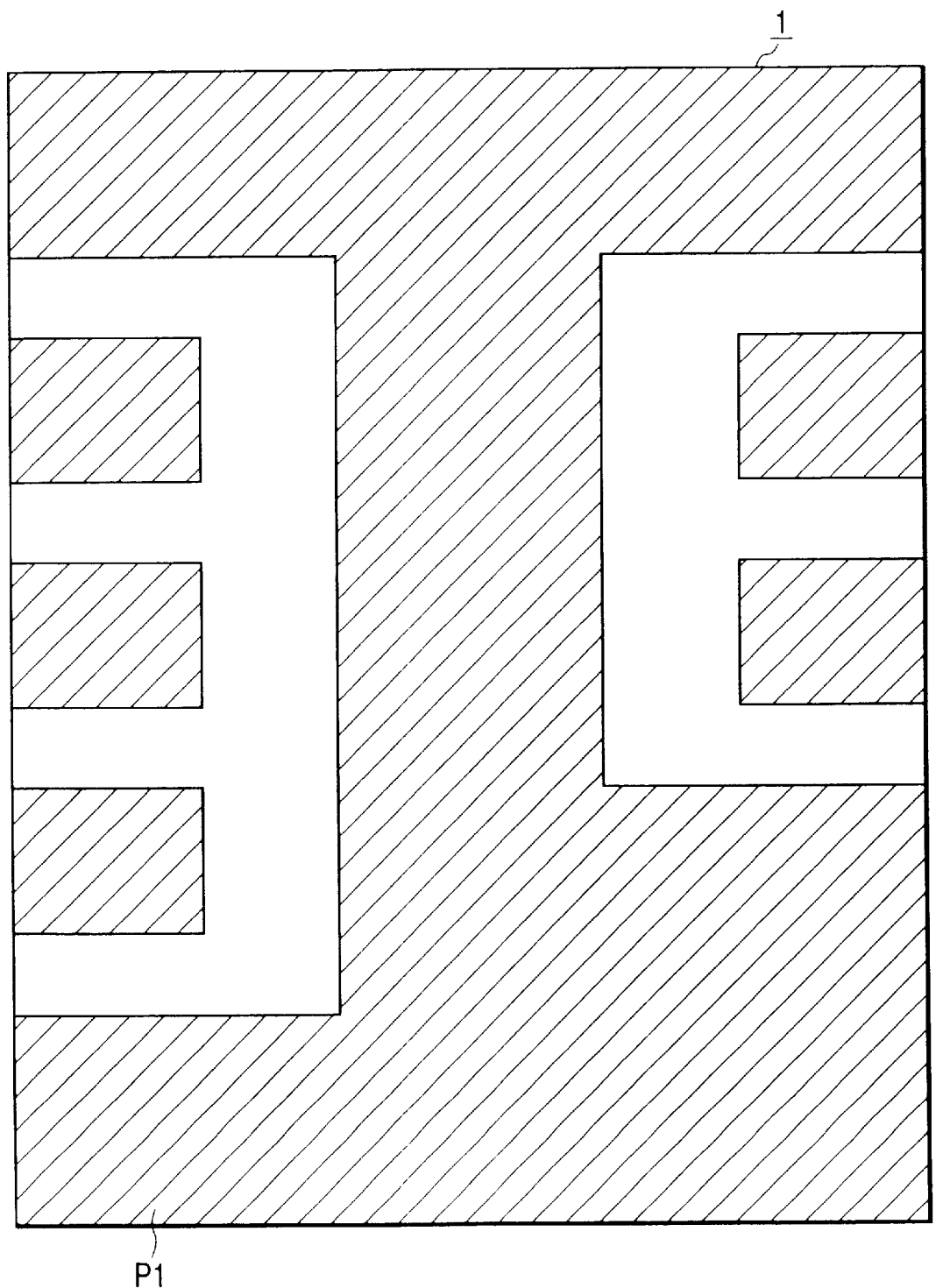
FIG. 3 shows the back of the alumina substrate.
Figure 4:
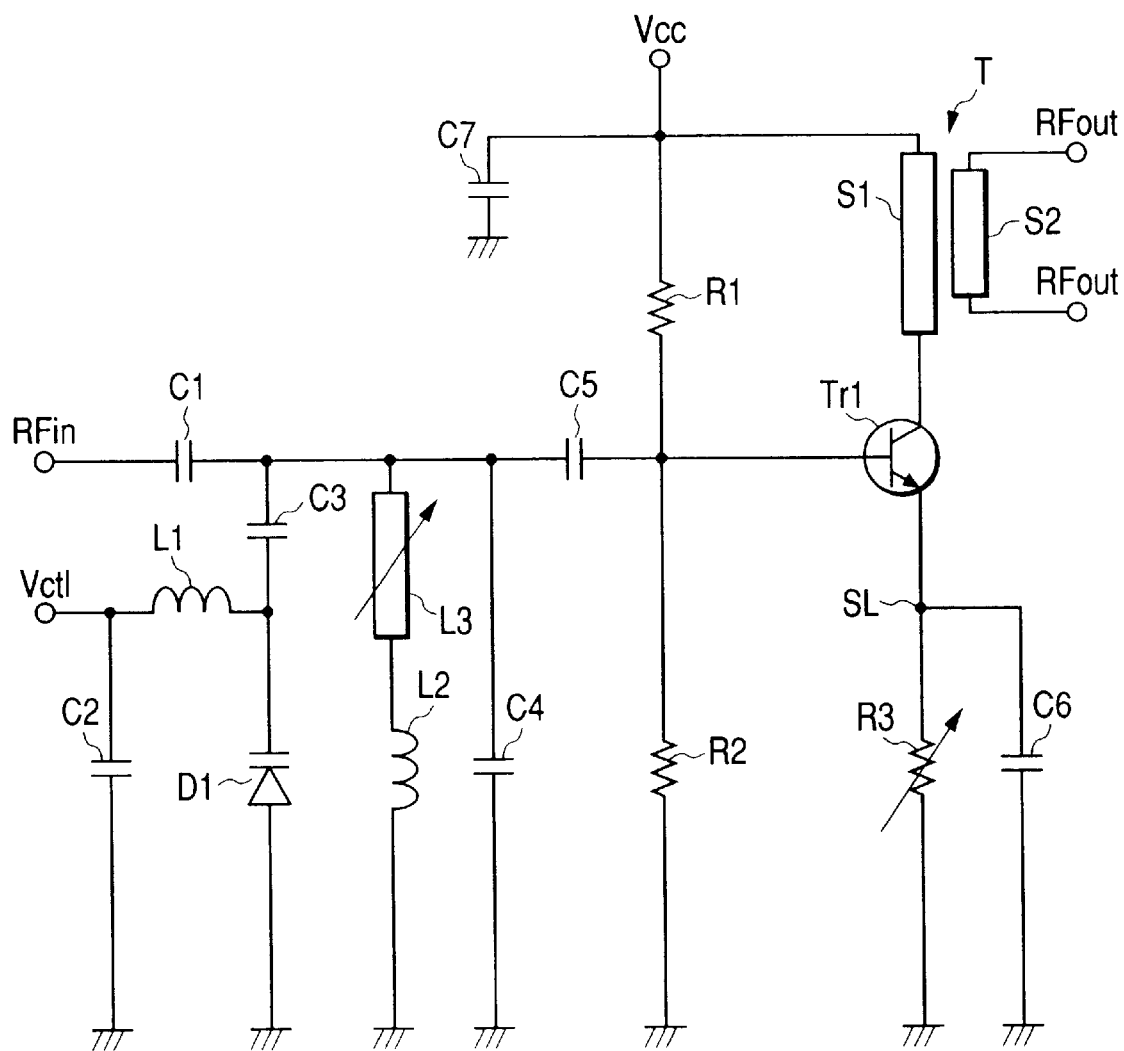
FIG. 4 is an explanatory drawing showing circuit configuration.
Figure 5:
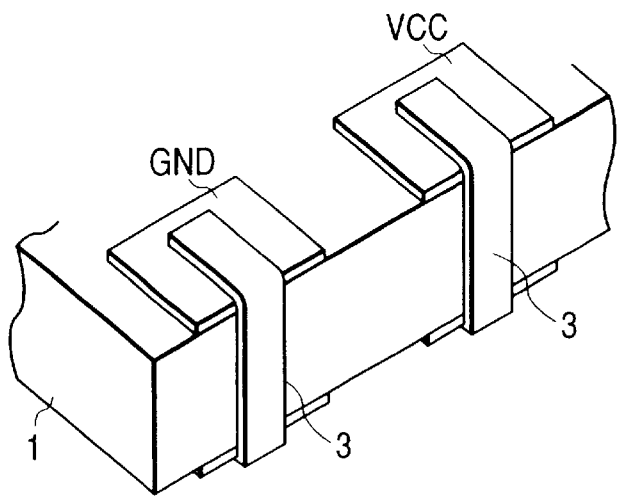
FIG. 5 is a perspective view showing an end-face electrode.
Figure 6:
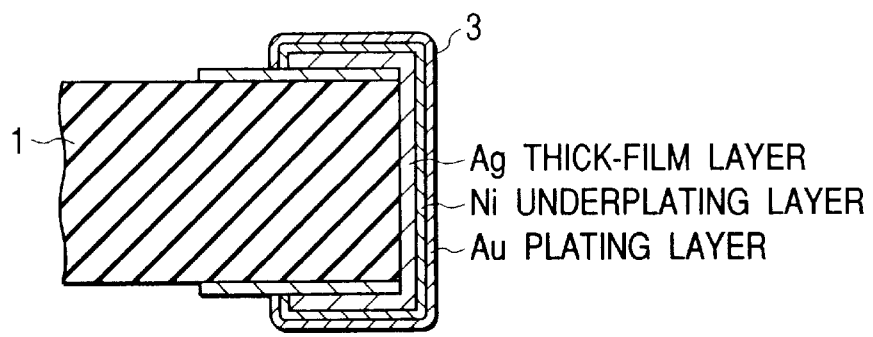
FIG. 6 is a sectional view showing the end-face electrode.
Figure 7A:
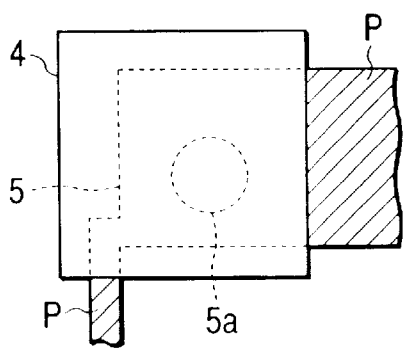
FIGS. 7A and 7B are explanatory drawings showing relationship between a semiconductor bare chip and a connection land.
Figure 7B:
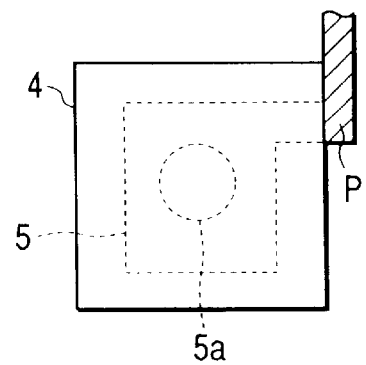

Explaining an embodiment of the invention referring to the drawings, FIG. 1 is a perspective view showing an electronic circuit unit, FIG. 2 is a plan showing the circuit configuration layout of an alumina substrate, FIG. 3 shows the back of the alumina substrate, FIG. 4 is an explanatory drawing showing the circuit configuration, FIG. 5 is a perspective view showing an end-face electrode, FIG. 6 is a sectional view showing the end-face electrode, FIGS. 7A and 7B are explanatory drawings showing relationship between a semiconductor bare chip and a connection land and FIGS. 8A to 8J are explanatory drawings showing a manufacturing process of the electronic circuit unit.

This embodiment is an example in which the electronic circuit unit is applied to a frequency tuning type booster amplifier, the frequency tuning type booster amplifier is used with it combined with an UHF tuner (not shown) to enhance the receive performance (particularly, the receive sensitivity and the antidisturbance characteristic) of a portable television set and has a function of selecting a TV signal having a desired frequency, amplifying the selected TV signal and inputting it to th e UHF tuner.

FIG. 1 shows the appearance of the frequency tuning type booster amplifier (the electric circuit unit), as shown in FIG. 1, the frequency tuning type booster amplifier is composed of an alumina substrate 1 on which circuit components described later are mounted and a shield 2 attached to the alumina substrate 1 and is a surface mounting component soldered on a mother board not shown. The alumina substrate 1 is formed so that it is square and flat and is acquired by subdividing the following divided strip after a large board is cut in to divided strips. The shield 2 is acquired by folding a metallic plate in the shape of a box and circuit components on the alumina substrate 1 are covered with the shield 2.

As shown in FIG. 2, circuit components and a conductive pattern that connects them are provided on the surface of the alumina substrate, 1 and as shown in FIG. 3, a conductive pattern as a back plate is provided on the back of the alumina substrate 1. The frequency turning type booster amplifier equivalent to this embodiment is provided with a tuning circuit and an amplifying circuit to select and amplify a TV signal, has circuit configuration shown in FIG. 4 and a character corresponding to that in a circuit diagram shown in FIG. 4 is allocated to each circuit component shown in FIG. 2. However, FIG. 4 shows an example of circuit configuration and the invention can also be applied to an electric circuit unit having another circuit configuration.

As shown in FIG. 4, the frequency tuning type booster amplifier is provided with capacitors C1 to C7, resistors R1 to R3, inductance elements L1 to L3, a diode D1, a transistor Tr1 and conductors S1 and S2 which are respectively a circuit component of the tuning circuit or the amplifying circuit, and these circuit components and the conductive pattern that connects them are provided on the surface of the alumina substrate 1. The conductive pattern is formed by Cr and Cu for example using thin-film technology such as sputtering, a character P is allocated to the conductive pattern in FIG. 2 and is expressed by hatching.

Briefly explaining the circuit configuration of the frequency tuning type booster amplifier, the frequency tuning type booster amplifier includes the tuning circuit composed of the inductance elements L2 and L3, the capacitors C3 and C4 and the diode D1 and the amplifying circuit composed of the transistor Tr1, the peripheral circuit elements (the resistors R1 to R3 and the capacitor C6) and an unbalance/balance conversion element T so as to select and amplify a TV signal having a desired frequency. TV signals having plural frequencies are input to the tuning circuit via the capacitor C1. As the tuning frequency (the resonant frequency) of the tuning circuit varies by the control of voltage (Vctl) applied to the cathode of the diode D1, only a desired TV signal is selected by harmonizing with the frequency of the desired TV signal and is input to the base of the transistor Tr1 of the amplifying circuit via the capacitor C5. Bias voltage is applied to the base of the transistor Tr1 via voltage dividers for base bias R1 and R2 and the collector current (the emitter current) of the transistor Tr1 is set according to the resistance value of the emitter resistor R3. A TV signal amplified by the transistor Tr1 is output from the collector and the unbalance/balance conversion element T is provided to the collector. The unbalance/balance conversion element T is formed by an inductance element composed of a pair of conductors S1 and S2 mutually coupled, a balanced TV signal is output from both ends of the conductor S2 and is input to the abovementioned UHF tuner.

As shown in FIG. 2, an electrode for grounding (GND), an electrode for input (Vcc, Vctl, RFin) and an electrode for output (RFout) are formed at the end of the alumina substrate 1 and are formed by a part of the conductive pattern P. The electrode for grounding, the electrode for input and the electrode for output are formed only on opposite two longer sides of the square alumina substrate 1 and are not formed on opposite two shorter sides. That is, the GND electrode is formed at both corners of one longer side of the alumina substrate 1, and the Vcc electrode, the RFin electrode and the Vctl electrode are formed between these GND electrodes. The GND electrode is formed at total three locations including both corners of the other longer side of the alumina substrate 1 and the vicinity and the two RFout electrodes are formed between these GND electrodes. As described later, the two longer sides of the alumina substrate 1 correspond to a parting line when a large board is cut into divided strips and the two shorter sides of the alumina substrate 1 correspond to a parting line when the divided strip is further subdivided.

In the meantime, as shown in FIG. 3, the conductive pattern P1 (the back plate) provided on the back of the alumina substrate is opposed to the electrodes for grounding (GND), the electrodes for input (Vcc, Vctl, RFin) and the electrodes for output (RFout) and as shown in FIGS. 5 and 6, both are made to conduct via an end-face electrode 3. The end-face electrode 3 is acquired by sequentially laminating an Ni underplating layer and an Au plating layer on an Au thick-film layer and the Au thick-film layer which is the lowest layer is made of material acquired by baking the following Ag paste at low temperature of approximately 200° C. after Ag paste not including a glass component is formed thickly. The middle Ni underplating layer is provided to facilitate the adhesion of the Au plating layer and the uppermost Au plating layer is provided to prevent Ag in the lowest layer from depositing on solder when the end-face electrode 3 is soldered on a soldering land of a mother board not shown. In an end product of the electronic circuit unit in which the shield 2 is attached to the alumina substrate 1, a leg 2a folded on the side of the shield 2 is soldered on the end-face electrode 3 that conducts to the electrode for grounding (GND) and the shield 2 is ground at four corners of the alumina substrate 1.

The capacitors C1 to C7 of the abovementioned circuit components are acquired by laminating an upper electrode on a lower electrode via a dielectric film such as $SiO_2$ and are formed thinly by sputtering. A Cu layer is provided on the surface of the upper electrode and Q of a resonant circuit is enhanced by the Cu layer. The lower electrode and the upper electrode of each capacitor C1 to C7 are connected to the conductive pattern P and as shown in FIG. 2, a close part (an air gap) for discharge G is provided to the conductive pattern P between the capacitor C7 and the Vcc electrode, the conductive pattern P between the capacitor C7 and the RFout electrode and the conductive pattern P between the capacitor C2 and the Vctl electrode. The close part G is formed by a pair of projections respectively provided to the opposite conductive patterns P and the ends of both projections are opposed via a predetermined gap. In this case, as the dimensional precision of the conductive pattern P and the GND electrode is high owing to thin-film technology, the gap in the close part G can be narrowed and discharge at low voltage is enabled. The capacitors C1 and C3 to C5 of the capacitors C1 to C7 are formed in the shape of a simple rectangle, however, the capacitors C2 and C7 are formed in a different shape in which two or more are combined. That is, the capacitor C2 has a concave shape in which two rectangles are protruded from one side of one rectangle and the capacitor C7 has a continuous shape in which three rectangles are respectively displaced in a direction of the longer side. The capacitors C2 and C7 are a capacitor for grounding requiring relatively large capacity, when the capacitors C2 and C7 for grounding have such different shapes, limited space on the alumina substrate 1 can be effectively utilized and the capacitors having desired capacity can be mounted densely.

Further, the capacitor C6 of the capacitors C1 to C7 is composed of two capacitors for grounding different in size and both are connected in parallel via a pair of conductive patterns P mutually separated. That is, as shown in FIG. 2, each one electrode of both capacitors for grounding C6 is connected to the conductive pattern P for grounding connected to the GND electrode, however, each other electrode of both capacitors for grounding C6 is connected to a connection land SL of the transistor Tr1 via the two conductive patterns P mutually separated. As clear from FIG. 4, as the capacitor C6 is provided between the emitter of the transistor Tr1 and the ground and the connection land SL is a location to which the emitter electrode of the transistor Tr1 is bonded via wire, the capacity of the capacitor C6 is set by the two capacitors for grounding connected in parallel via the conductive patterns P mutually separated. Therefore, as the inductance of the whole conductive pattern P from the emitter electrode of the transistor Tr1 to the ground via the capacitor C6 decreases, the grounding effect by the capacitor for grounding C6 of the connection land SL is enhanced and a parasitic oscillation frequency by each capacitor for grounding C6 and each conductive pattern P is increased, parasitic oscillation can be eliminated by setting the frequency so that it is higher than the operating point frequency of the transistor Tr1.

The resistors R1 to R3 are formed by a resistant film such as $TaSiO_2$ using thin-film technology such as sputtering and a dielectric film such as SiO$_2$ is provided on the surface if necessary. As shown in FIG. 2, the resistors R1 and R2 of the three resistors R1 to R3 are thinly formed in close positions in parallel on the alumina substrate 1 and the residual resistor R3 is thinly formed in a position apart from the resistors R1 and R2. As the resistors R1 and R2 are thinly formed in close positions as described above, the ratio of the dispersion of the respective resistance values between the whole resistor R1 and the whole resistor R2 can be equalized even if the resistance value of each resistor R1, R2 disperse for a desired value. As clear from FIG. 4, the resistors R1 and R2 function as a voltage divider for base bias of the transistor Tr1 and the voltage of R1/(R1+R2)×Vcc is applied to the base of the transistor Tr1. As the ratio of the dispersion of the respective resistance values between the whole resistor R1 and the whole resistor R2 which are voltage dividers for base bias is always the same as described above, the trimming of the resistance value of the resistors R1 and R2 is not required. In the meantime, the resistor R3 functions as a resistor for the emitter of the transistor Tr1, current flows from the Vcc electrode to the collector and the emitter of the transistor Tr1 and further, is grounded via the resistor R3. As contribution to the amplification degree of the transistor Tr1 by the resistor R3 which is the resistor for the emitter out of the resistors R1 to R3 is the largest, only the resistor R3 is trimmed so that the current value is fixed and the output is adjusted.

Figure 9:
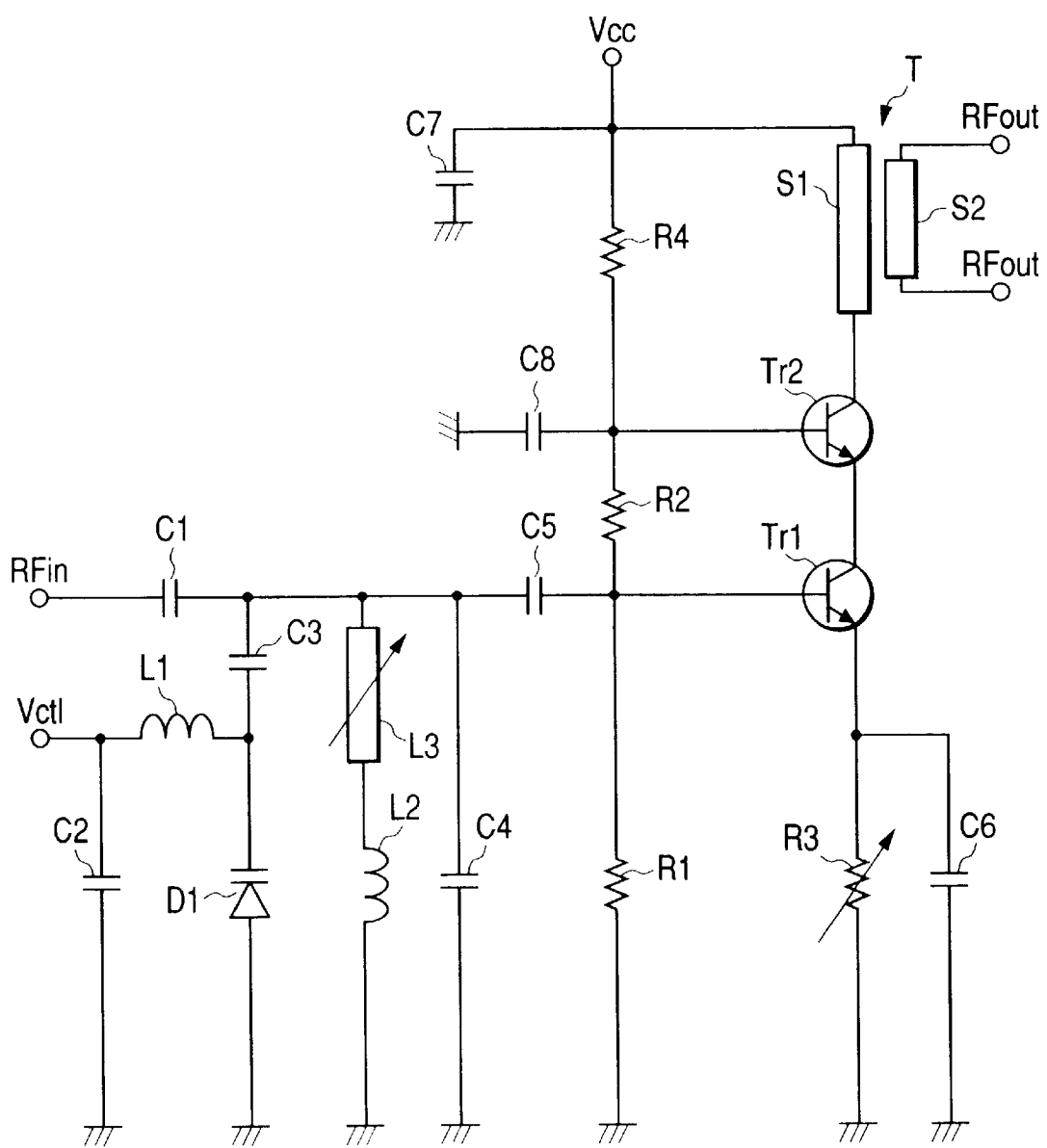
FIG. 9 is an explanatory drawing showing another circuit configuration.

If another transistor Tr2 is connected to a transistor Tr1 in series as shown in FIG. 9, the trimming of the respective resistance values of resistors R1, R2 and R4 is not required as long as these resistors R1, R2 and R4 which are voltage dividers for base bias of both transistors Tr1 and Tr2 are thinly formed in mutually close positions on an alumina substrate 1. Therefore, in this case, the current values of both transistors Tr1 and Tr2 can also be set by trimming only a resistor R3 which is a resistor for the emitter.

Inductance elements L1 to L3 and conductors S1 and S2 are formed by Cr and Cu using thin-film technology such as sputtering and are connected to a conductive pattern P. A Cu layer is provided on the surface of each inductance element L1 to L3 and Q of a resonant circuit is enhanced by the Cu layer. The inductance elements L1 and L2 are formed in a square spiral shape and each one end is respectively bonded to a Vctl electrode and a conductive pattern P for grounding via wire. The inductance element L2 is provided for setting a substantial resonance frequency and the inductance element L3 continues to the other end of the inductance element L2. The inductance element L3 is a conductive pattern for regulation for regulating a resonance frequency and as shown by a broken line in FIG. 2, the number of turns of the inductance element L2 is increased and a resonance frequency is regulated by trimming the inductance element L3. In this case, if the conductor width of the trimmed inductance element L3 is equal to that of the inductance element L2 for setting a resonance frequency, the characteristic impedance of the inductance element L2 and the inductance element L3 is equal.

Figure 10:
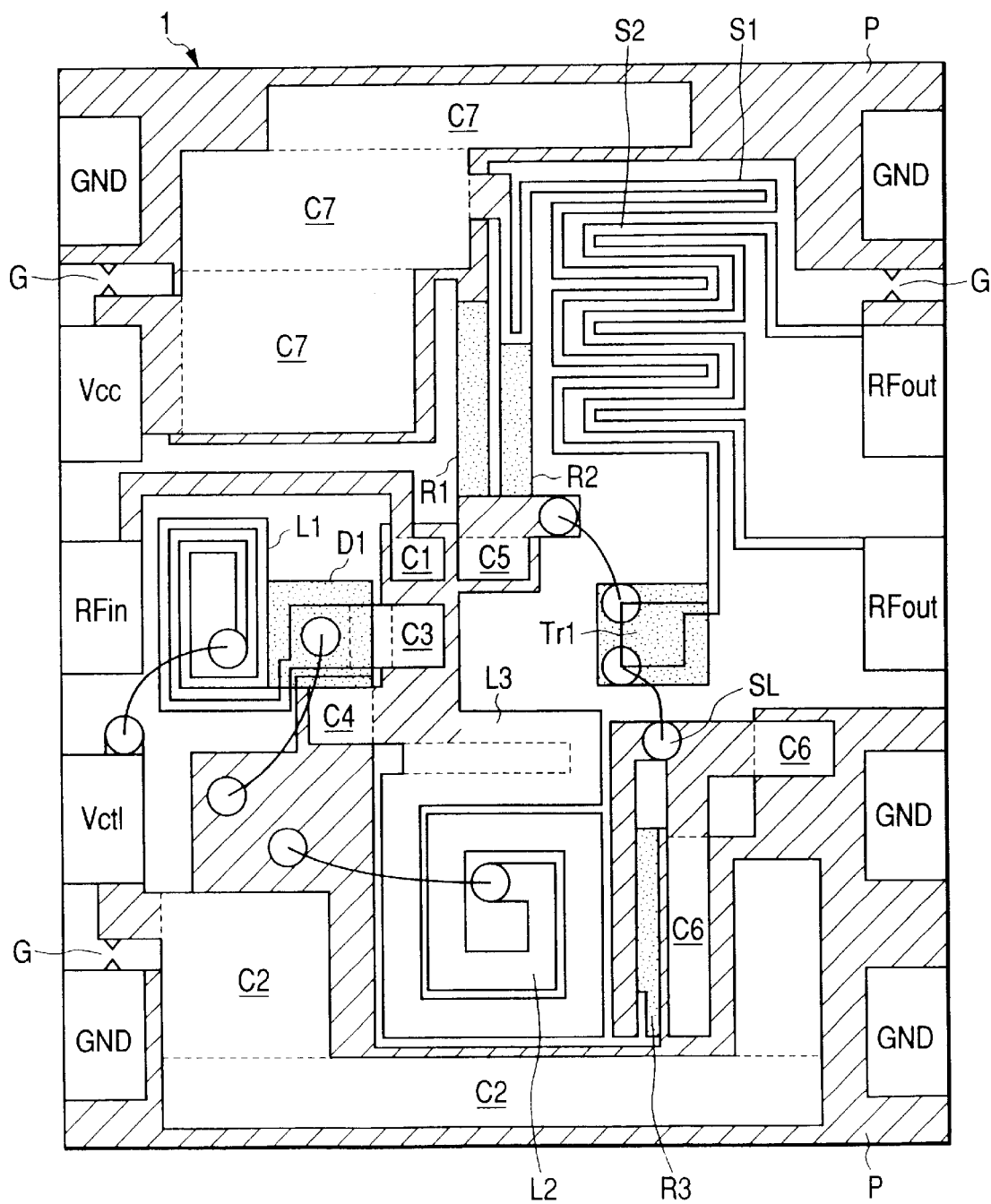
FIG. 10 is a plan showing another circuit configuration layout of an alumina substrate.

As described above, a unbalance/balance conversion element T is formed by an inductance element composed of a pair of conductors S1 and S2 mutually coupled and the conductors S1 and S2 are thinly formed on the alumina substrate 1. These conductors S1 and S2 are formed in a spiral shape so that they are opposite via a predetermined gap on the alumina substrate 1, both ends of one conductor S1 are connected to the collector electrode of the transistor Tr1 and the conductive pattern P connected to a capacitor C7 and both ends of the other conductor S2 are connected to a pair of RFout electrodes. In this case, as the dimensional precision of the thinly formed conductors S1 and S2 is high, a gap between both conductors S1 and S2 is narrowed, a desired degree of coupling can be secured and the small-sized unbalance/balance conversion element T can be provided in limited space on the alumina substrate 1. As shown in FIG. 10, a pair of conductors S1 and S2 opposite via a predetermined gap may be also formed zigzag on the alumina substrate 1.

A diode D1 and the transistor Tr1 are realized by mounting each semiconductor bare chip on a connection land of the conductive pattern P thinly formed on the alumina substrate 1 and respectively bonding the semiconductor bare chip to the conductive pattern P via wire. That is, as shown in FIG. 2, the semiconductor bare chip for the diode D1 is square, one electrode provided on the lower surface is fixed to the connection land using a conductive adhesive such as cream solder and conductive paste and the other electrode provided on the upper surface of the semiconductor bare chip is bonded to a predetermined part of the conductive pattern P via wire. The semiconductor bare chip for the transistor Tr1 is also square, the collector electrode provided on the lower surface is fixed to the connection land using a conductive adhesive, and the base electrode and the emitter electrode are bonded to a predetermined part of the conductive pattern P via wire. As the abovementioned end-face electrode 3, an Ni underplating layer and an Au plating layer are also sequentially laminated on the connection land. As shown in FIGS. 7A and 7B, a connection land 5 is formed so that the area is smaller than the area of the lower surface of the semiconductor bare chip 4, and as a part in which a conductive adhesive accumulates is secured under the semiconductor bare chip 4 by adopting such configuration, an accident that the conductive adhesive is forced out of the outline of the semiconductor bare chip 4 and is short-circuited with the surrounding conductive pattern P can be prevented beforehand. As an opening 5a is provided inside the connection land 5 and hereby, an extra conductive adhesive accumulates in the opening 5a, the extrusion of the conductive adhesive can be more securely prevented.

Next, a manufacturing process of the electronic circuit unit configured as described above will be described mainly using FIG. 8.

First, as shown in FIG. 8A, after TaSiO$_2$ is sputtered on the whole surface of the alumina substrate 1, apart equivalent to the resistors R1 to R3 is formed by etching it in a desired shape and forming a resistant film 6. Next, after Cr or Cu is sputtered on the resistant film 6, is etched in a desired shape and a lower electrode 7 is formed as shown in FIG. 8B, SiO$_2$ is sputtered on the lower electrode 7, is etched in a desired shape and a dielectric film 8 is formed as shown in FIG. 8C. Next, as shown in FIG. 8D, after Cr or Cu is sputtered on the dielectric film 8, it is etched in a desired shape and an upper electrode 9 is formed. As a result, a part equivalent to a conductive pattern P, inductance elements L1 to L3 and conductors S1 and S2 is formed by the lower electrode 7 or the upper electrode 9 and a part equivalent to capacitors C1 to C7 is formed by the lamination of the lower electrode 7, the dielectric film 8 and the upper electrode 9. Next, after a Cu layer is formed by plating or thin-film technology on the surface the part equivalent to the inductance elements L1 to L3, the conductors S1 and S2 and the capacitors C1 to C7, a passivation film 10 is formed in the part except the conductive pattern P as shown in FIG. 8E. Next, as shown in FIG. 8F, after Cr or Cu is sputtered on the whole back of the alumina substrate 1, apart equivalent to a conductive pattern P1 on the back side is formed by etching Cr or Cu in a desired shape and forming a back plate 11.

In the above-described processes shown in FIGS. 8A to 8F, a large board made of alumina on which a parting groove is extended lengthwise and crosswise is handled and in the following processes shown in FIGS. 8G to 8J, a divided strip acquired by cutting the large board along the parting groove in one direction is handed.

That is, after the large board is cut into divided strips, an Ag layer 12 is thickly formed on both end faces of the alumina substrate 1 which are the cut surface of the divided strip as shown in FIG. 8G, and electrodes for grounding (GND), electrodes for input (Vcc, Vctl, RFin) and electrodes for output (RFout) of the conductive patterns P and P1 respectively provided both on the surface and on the back of the alumina substrate 1 conduct via the Ag layer 12. This Ag layer 12 is equivalent to the above-described Ag thick layer of the end-face electrode 3 and is made of Ag paste including no glass component and baked at low temperature. Such a process for forming the thick Ag layer 12 can also be executed for one divided strip, however, if plural divided strips are overlapped via slight clearance, the Ag layers 12 of the plural divided strips can be simultaneously thickly formed and the electronic circuit unit is suitable for mass production. Next, after an Ni underplating layer and an Au layer are sequentially plated on each surface of the Ag layer 12 and a connection land on which a semiconductor bare chip is mounted, semiconductor bare chips for the diode D1 and the transistor Tr1 are fixed on each connection land using a conductive adhesive such as cream solder and conductive paste as shown in FIG. 8H. In this case, as described above, as the connection land is formed so that the area is smaller than the area of the lower surface of the semiconductor bare chip, the extrusion of the conductive adhesive from the semiconductor bare chip is prevented and the conductive adhesive is prevented from being short-circuited with the conductive pattern P around the semiconductor bare chip undesirably. Next, after each semiconductor bare chip is bonded to a predetermined part of the conductive pattern P via wire as shown in FIG. 8I, output is regulated by trimming the resistor R3 which is a resistor for the emitter and a resonance frequency is regulated by trimming the inductance element L3 which is a conductive pattern for regulation as shown in FIG. 8J. In this case, as the regulation of a resonance frequency is performed in a state of a divided strip before it is subdivided into an individual alumina substrate 1 and the electrode for grounding (GND) is provided at the corner of each alumina substrate 1, an electrode for grounding (GND) is necessarily located between an electrode for input (Vcc, Vctl, RFin) and an electrode for output (RFout) respectively provided to an adjacent alumina substrate 1 and the regulation of a resonance frequency is prevented from having a bad effect upon the circuit of the adjacent alumina substrate 1.

Next, after the shield 2 is attached to the individual alumina substrate 1 which is the divided strip and the leg 2a of the shield 2 is soldered on the end-face electrode 3 that conducts to the electrode for grounding (GND), the electronic circuit unit shown in FIG. 1 is acquired by subdividing the divided strip into an individual alumina substrate 1 along the other parting groove.

According to the electronic circuit unit equivalent to the abovementioned embodiments configured as described above, as circuit elements such as the capacitors C1 to C7, the resistors R1 to R3, the inductance elements L1 to L3 and the conductors S1 and S2 and the conductive pattern P connected to these circuit elements are thinly formed on the alumina substrate 1, the semiconductor bare chips for the diode D1 and the transistor Tr1 are bonded on the alumina substrate 1 via wire and the end-face electrode 3 connected to the electrode for grounding and the electrode for input-output respectively of the conductive pattern is provided on the side of the alumina substrate 1, required circuit components can be densely mounted on the alumina substrate 1 using thin-film technology and the wire bonding of the semiconductor devices and the surface-mounting type electronic circuit unit suitable for miniaturization can be realized.

As the unbalance/balance converter is formed by a pair of conductors S1 and S2 thinly formed on the alumina substrate 1, a gap between both conductors S1 and S2 is narrowed, a desired degree of coupling can be secured and the electronic circuit unit also has an advantage to miniaturization from this standpoint.

In the abovementioned embodiments, the case where a pair of conductors S1 and S2 forming the unbalance/balance converter are thinly formed on the same surface of the alumina substrate 1 is described, however, a pair of conductors S1 and S2 may be also laminated on the alumina substrate 1 via an insulator such as $SiO_2$ as the capacitors C1 to C7 and at this time, space for which both conductors account on the alumina substrate 1 can be more reduced, As the close part G for discharge is provided to the conductive pattern P connecting the electrodes for input (Vcc, Vctl) or the electrodes for output (RFout) and the capacitors C2 and C7, not only the breakdown of these capacitors C2 and C7 by static electricity can be securely prevented but the air gap G can be formed with high dimensional precision by thin-film technology, and the dimension of the gap in the close part G is reduced and discharge at low voltage is enabled.

Also, as the inductance element L2 for setting a resonance frequency out of t-he inductance elements thinly formed is formed in a spiral shape to make the inductance element L2 a concentrated constant type inductor for resonance, distance between conductors of the inductance element L2 is narrowed, the inductor for resonance can be miniaturized and from this standpoint, the miniaturization of the electronic circuit unit can also be realized. As Cu plating is provided to the surface of all the inductance elements L1 to L3 including the inductance element L2, Q of the resonant circuit can be enhanced.

Further, as the number of turns of the inductance element L2 is increased by trimming the inductance element L3 using the inductance element L3 connected to the inductance element L2 for setting a resonance frequency for a conductive pattern for regulation so as to regulate a resonance frequency, a resonance frequency can be simply regulated and in addition, as each conductor width of the trimmed inductance element L3 and the inductance element L2 for setting a resonance frequency is equalized, the characteristic impedance of the inductance element L2 and the inductance element L3 is equal.

The invention is embodied in the abovementioned embodiments and produces the following effect.

As circuit elements including the capacitors and the resistors and the conductive pattern are thinly formed on the alumina substrate, the semiconductor bare chip is bonded on the alumina substrate via wire and the inductance element composed of a pair of conductors on the alumina substrate is thinly formed on the alumina substrate to form the unbalance/balance converter, not only circuit components required on the alumina substrate can be densely mounted but the gap between both conductors forming the unbalance/balance converter is reduced, a desired degree of coupling can be secured and the electronic circuit unit can be miniaturized.

As circuit elements including the capacitors, the resistors and the inductance elements and the conductive pattern connected to these circuit elements are thinly formed on the alumina substrate, the semiconductor bare chip is bonded via wire and the close part for discharge is provided to the conductive pattern connecting at least one of the electrode for input and the electrode for output and the capacitor, circuit components required on the alumina substrate are densely mounted and the electronic circuit unit can be miniaturized. The breakdown of the capacitors by static electricity can be securely prevented owing to the close part and in addition, the discharge gap in the close part is reduced and discharge at low voltage is enabled.

As circuit elements including the capacitors, the resistors and the inductance elements are thinly formed on the alumina substrate, the semiconductor bare chip is bonded via wire and at least the inductance element forming the inductance element for setting a resonance frequency is formed in a spiral shape, not only circuit components required on the alumina substrate can be densely mounted but distance between conductors of the inductance element for setting a resonance frequency can be reduced by thin-film technology and the miniaturization of the electronic circuit unit can be realized.

What is claimed is:

1. An electronic circuit unit comprising:
   an alumina substrate;
   thin film circuit elements including a capacitor and a resistor, the thin film circuit elements formed on the alumina substrate;
   a thin film conductive pattern connected to the circuit elements, formed on the alumina substrate;
   a semiconductor bare chip mounted on the alumina substrate and bonded to the conductive pattern via wire; and
   an unbalance/balance converter including a pair of thin film inductance elements composed of a pair of conductive paths opposing each other at a predetermined interval on the alumina substrate.

2. An electronic circuit unit according to claim 1, wherein the pair of conductors are formed on the same surface of the alumina substrate.

3. An electronic circuit unit according to claim 1, wherein the pair of conductors are laminated on the alumina substrate via an insulator.

4. An electronic circuit unit according to claim 2, wherein the pair of conductors are laminated on the alumina substrate via an insulator.

5. An electronic circuit unit according to claim 1, wherein the pair of conductors are formed in one of a spiral shape and zigzag.

6. An electronic circuit unit according to claim 2, wherein the pair of conductors are formed in one of a spiral shape and zigzag.

7. An electronic circuit unit according to claim 3, wherein the pair of conductors are formed in one of a spiral shape and zigzag.

8. An electronic circuit unit according to claim 4, wherein the pair of conductors are formed in one of a spiral shape and zigzag.

9. An electronic circuit unit, comprising:
   an alumina substrate;
   thin film circuit elements including a capacitor, a resistor and an inductance element, the thin film circuit elements formed on the alumina substrate;
   thin film conductive patterns connected to the circuit elements and formed on the alumina substrate;
   a semiconductor bare chip mounted to the alumina substrate and bonded to a first of the conductive patterns via wire;
   an electrode for input and an electrode for output, respectively connected to a second and a third of the conductive patterns, provided on opposite sides of the alumina substrate;
   the capacitor connected to a fourth of the conductive patterns and connected to one of the second and third part of the conductive patterns; and
   a close part for discharge is provided between one of the second and third part of the conductive patterns and a ground conductive pattern.

10. An electronic circuit unit according to claim 9, wherein:
    the close part for discharge provides a tip projecting from one of the second and third part of the conductive patterns to an opposing tip projecting from the ground conductive pattern.

11. An electronic circuit unit, comprising:
    an alumina substrate;
    thin film circuit elements including a capacitor, a resistor and an inductance element respectively formed on the alumina substrate; and
    a semiconductor bare chip bonded to the alumina substrate via wire, wherein:
    the inductance element is a spiral thin film for setting a resonance frequency;
    a thin film conductive pattern for adjustment is connected to the inductance element for setting the resonance frequency; and
    the resonant frequency is adjusted by increasing a number of turns of the inductance element for setting the resonance frequency by trimming of the conductive pattern for adjustment.

12. An electronic circuit unit according to claim 11, wherein Cu plating is provided on a surface of the inductance element.

13. An electronic circuit unit according to claim 11, wherein a respective conductor width of the inductance element and the trimmed conductive pattern are set to a substantially equal value.

* * * * *